US012713620B2

(12) United States Patent
Kim et al.

(10) Patent No.: US 12,713,620 B2
(45) Date of Patent: Aug. 18, 2026

(54) MAGNETIC TUNNELING JUNCTION DEVICE AND MEMORY DEVICE INCLUDING THE SAME

(71) Applicant: Samsung Electronics Co., Ltd., Suwon-si (KR)

(72) Inventors: Kwangseok Kim, Seoul (KR); Seonggeon Park, Seongnam-si (KR); Kiwoong Kim, Hwaseong-si (KR); Naoki Hase, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 684 days.

(21) Appl. No.: 17/735,599

(22) Filed: May 3, 2022

(65) Prior Publication Data

US 2023/0019156 A1 Jan. 19, 2023

(30) Foreign Application Priority Data

Jul. 15, 2021 (KR) ........................ 10-2021-0093140

(51) Int. Cl.
*H10B 61/00* (2023.01)
*G11C 11/16* (2006.01)
(Continued)

(52) U.S. Cl.
CPC ............ *H10B 61/22* (2023.02); *G11C 11/161* (2013.01); *H10N 50/80* (2023.02); *H10N 50/85* (2023.02); *H10N 50/01* (2023.02)

(58) Field of Classification Search
CPC ........ H10N 50/80; H10N 50/85; H10N 50/01; H10N 50/10; H10B 61/22; G11C 11/161
See application file for complete search history.

(56) References Cited

U.S. PATENT DOCUMENTS 9,166,143 B1 10/2015 Gan et al.
9,478,730 B2 10/2016 Chepulskyy et al.
(Continued)

FOREIGN PATENT DOCUMENTS

CN 112750945 A 5/2021
EP 4 053 925 A2 9/2022
(Continued)

OTHER PUBLICATIONS

Extended European Search Report dated Jan. 5, 2023 issued in corresponding European Patent Application No. 22179959.6-1212.
(Continued)

*Primary Examiner* — Fernando L Toledo
*Assistant Examiner* — Marshall Mu-Nuo Hatfield
(74) *Attorney, Agent, or Firm* — HARNESS, DICKEY & PIERCE, P.L.C.

(57) ABSTRACT

Provided are a magnetic tunneling junction device having a fast operating speed without reducing or with increasing data retention and/or a memory device including the magnetic tunneling junction device. The magnetic tunneling junction device includes a free layer having a first surface and a second surface opposite the first surface; a pinned layer facing the first surface of the free layer; a first oxide layer between the pinned layer and the free layer; and a second oxide layer on the second surface of the free layer. The free layer includes a first free layer adjacent to the first oxide layer and a second free layer adjacent to the second oxide layer. The first free layer includes a magnetic material not doped with a non-magnetic metal, and the second free layer includes a magnetic material doped with the non-magnetic metal.

26 Claims, 16 Drawing Sheets

(51) Int. Cl.

| | |
|---|---|
| ***H10N 50/01*** | (2023.01) |
| ***H10N 50/80*** | (2023.01) |
| ***H10N 50/85*** | (2023.01) |

(56) References Cited

U.S. PATENT DOCUMENTS

| | | | | |
|---|---|---|---|---|
| 9,842,988 | B2 | 12/2017 | Liu et al. | |
| 10,867,625 | B1 * | 12/2020 | Freitag | G11B 5/235 |
| 11,328,743 | B2 | 5/2022 | Nakatani et al. | |
| 2007/0258170 | A1 * | 11/2007 | Yuasa | H10N 50/10<br>427/127 |
| 2010/0176470 | A1 | 7/2010 | Horng et al. | |
| 2013/0177781 | A1 * | 7/2013 | Chepulskyy | H01F 10/3268<br>428/812 |
| 2013/0221460 | A1 * | 8/2013 | Jan | H01F 10/3254<br>257/E29.323 |
| 2014/0175582 | A1 * | 6/2014 | Apalkov | G11C 11/161<br>257/425 |
| 2014/0353783 | A1 | 12/2014 | Oh et al. | |
| 2016/0035970 | A1 * | 2/2016 | Tang | H10N 50/80<br>257/427 |
| 2016/0079520 | A1 * | 3/2016 | Park | H10N 50/10<br>257/421 |
| 2017/0025602 | A1 * | 1/2017 | Liu | H10N 50/85 |
| 2018/0005746 | A1 * | 1/2018 | Thomas | G03F 7/16 |
| 2018/0301619 | A1 | 10/2018 | Oguz et al. | |
| 2018/0351086 | A1 * | 12/2018 | Tang | H10N 50/01 |
| 2019/0109277 | A1 * | 4/2019 | Jan | H10N 50/85 |
| 2019/0148626 | A1 * | 5/2019 | Honma | H10N 50/01<br>257/421 |
| 2020/0144494 | A1 | 5/2020 | Jan et al. | |
| 2020/0158796 | A1 * | 5/2020 | Ikhtiar | H10N 50/10 |
| 2020/0303632 | A1 * | 9/2020 | Watanabe | H10B 61/22 |
| 2020/0403149 | A1 * | 12/2020 | Guisan | H10N 52/80 |

FOREIGN PATENT DOCUMENTS

| | | | |
|---|---|---|---|
| JP | 2020-155445 | A | 9/2020 |
| KR | 10-2007-0049654 | A | 5/2007 |
| KR | 10-2176797 | B1 | 9/2014 |
| KR | 10-2018-0131318 | A | 12/2018 |
| WO | WO-2019-193871 | A1 | 10/2019 |

OTHER PUBLICATIONS

European Office Action dated Oct. 16, 2024 issued in European Patent Application No. 23 189 476.7-1211.

Korean Office Action issued on Dec. 2, 2025 for KR Patent Application No. 10-2021-0093140 (with translation).

* cited by examiner

MAGNETIC TUNNELING JUNCTION DEVICE AND MEMORY DEVICE INCLUDING THE SAME

CROSS-REFERENCE TO RELATED APPLICATION

This application is based on and claims priority under 35 U.S.C. § 119 to Korean Patent Application No. 10-2021-0093140, filed on Jul. 15, 2021, in the Korean Intellectual Property Office, the disclosure of which is incorporated by reference herein in its entirety.

BACKGROUND

Some example embodiments relate to magnetic tunneling junction devices and/or memory devices including the magnetic tunneling junction devices.

A magnetic memory device such as magnetic random access memory (MRAM) stores data by using a change in the resistance of a magnetic tunneling junction device. The resistance of the magnetic tunneling junction device varies with the magnetization direction of a free layer. For example, when the magnetization direction of the free layer is the same as (parallel with each other) the magnetization direction of a pinned layer, the magnetic tunneling junction device may have low resistance, and when the magnetization directions are opposite to each other (antiparallel with each other), the magnetic tunneling junction device may have high resistance. When this characteristic is used in a memory device, for example, the magnetic tunneling junction device having low resistance may correspond to data such as '0' and the magnetic tunneling junction device having high resistance may correspond to data such as '1'.

Such a magnetic memory device has advantages such as non-volatility, high-speed operation, and/or high durability. For example, Spin Transfer Torque-Magnetic RAM (STT-MRAM) that is currently mass-produced may have an operating speed of about 50 to 100 nsec and also have improved/excellent data retention greater than or equal to 10 years. In addition, research is underway to achieve a faster operating speed of less than 10 nsec.

SUMMARY

Provided are magnetic tunneling junction devices having a fast operating speed without reducing, or with minimally reducing, data retention and/or memory devices including the magnetic tunneling junction devices.

Additional aspects will be set forth in part in the description which follows and, in part, will be apparent from the description, or may be learned by practice of various example embodiments.

According to some example embodiments, a magnetic tunneling junction device includes a free layer having a first surface and a second surface opposite the first surface; a pinned layer facing the first surface of the free layer; a first oxide layer between the pinned layer and the free layer; and a second oxide layer disposed on the second surface of the free layer. The free layer includes a first free layer adjacent to the first oxide layer and a second free layer adjacent to the second oxide layer. The first free layer includes a magnetic material not doped with/not including a non-magnetic metal, and the second free layer includes a magnetic material doped with/including the non-magnetic metal.

The magnetic material of the first free layer and the second free layer may include at least one selected from the group consisting of or including Fe, Co, Ni, Mn, a Fe-containing alloy, a Co-containing alloy, a Ni-containing alloy, a Mn-containing alloy and a Heusler alloy.

The non-magnetic metal of the second free layer may include at least one selected from the group consisting of or including Mg, Ru, Ir, Ti, Zn, Ga, Ta, Al, Mo, Zr, Sn, W, Sb, V, Nb, Cr, Ge, Si, Hf, Tb, Sc, Y, Rh, In, Ca, Sr, Ba, Be, V, Mn, Li, Cd, Pb, Ga, and Mo.

The first free layer may further include boron (B).

The second free layer may not include boron or may include a trace amount of boron.

The second free layer may include boron at a concentration less than that of the first free layer.

A boron concentration of the first free layer may be in the range of about 5 at % to about 50 at %.

A boron concentration of the second free layer may be within a range of 0 at % to about 25 at %.

The second oxide layer may include an oxide material that absorbs boron in the second free layer.

A concentration of boron in the first free layer may be a peak, e.g. a local or global maximum at an interface with the first oxide layer and may gradually decreases toward the second free layer, and a concentration of boron in the second free layer may be a peak, e.g. a local or global maximum at an interface with the first free layer and may gradually decreases toward the second oxide layer.

The second oxide layer may include at least one selected from the group consisting of or including HfOx, NbOx, TaOx, and WOx.

The second oxide layer may further include boron absorbed from the second free layer.

The first oxide layer may include MgO and the second oxide layer does not include MgO.

A doping concentration of the non-magnetic metal in the second free layer may be in the range of about 5 at % to about 50 at %.

The first free layer may further include a non-magnetic metal diffused from the second free layer, and a concentration of the non-magnetic metal in the first free layer may gradually increase in a direction of an interface with the second free layer from the first oxide layer.

A concentration of the non-magnetic metal in the second free layer may be a peak, e.g. a local or global maximum at an interface with the first free layer and may gradually decrease toward the second oxide layer.

The concentration of the non-magnetic metal may be a peak, e.g. a local or global maximum at a midpoint of the second free layer between the first free layer and the second oxide layer, and may gradually decrease in a direction of the first free layer and in a direction of the second oxide layer from the midpoint in the second free layer.

The free layer may further include a third free layer between the first free layer and the second free layer and including a magnetic material doped with/including a non-magnetic metal.

A doping concentration of the non-magnetic metal in the second free layer may be greater than a doping concentration of the non-magnetic metal in the third free layer.

The second free layer and the third free layer may include different non-magnetic metals.

The first free layer may further include boron, the third free layer may include boron at a concentration less than that of the first free layer, and the second free layer may include boron at a concentration less than that of the third free layer or does not include boron.

The first oxide layer may include a metal oxide having a stoichiometrically oxygen-deficient composition.

The first oxide layer may include MgO, and a proportion of Mg in the first oxide layer is greater than 50 at % and a proportion of O is less than 50 at %.

The first oxide layer may include a first region adjacent to the pinned layer and a second region adjacent to the free layer. A proportion of oxygen or nitrogen in the second region may be greater than a proportion of a respective one of oxygen or nitrogen in the first region.

The first oxide layer may further include a metal layer between the first region and the second region.

The second oxide layer may include a metal oxide having a stoichiometrically oxygen-deficient composition.

An oxygen affinity of the non-magnetic metal of the free layer may be greater than an oxygen affinity of the magnetic material of the free layer.

According to some example embodiments, a magnetic tunneling junction device includes a free layer having a first surface and a second surface opposite the first surface; a pinned layer facing the first surface of the free layer; a first oxide layer between the pinned layer and the free layer; and a second oxide layer on the second surface of the free layer. The free layer includes a magnetic material doped with/including a non-magnetic metal, and a concentration of the non-magnetic metal in the free layer is a peak, e.g. a local or global minimum at the first surface and continuously varies from the first surface along the second surface.

The concentration of the non-magnetic metal in the free layer may be a peak, e.g. a local or global maximum at the second surface and may continuously and/or gradually increase from the first surface to the second surface.

The concentration of the non-magnetic metal in the free layer may be a local or global maximum at a distance from the first surface between ⅔ and ⅘ of a total thickness of the free layer, and may continuously and/or gradually decreases from a maximum point in a direction of the first surface and in a direction of the second surface.

The free layer may further include boron, wherein a concentration of boron in the free layer continuously and gradually decreases from the first surface toward the second surface.

According to some example embodiments, a memory device includes a magnetic tunneling junction device and a plurality of memory cells each including a switching device connected to the magnetic tunneling junction device. The magnetic tunneling junction device includes a free layer having a first surface and a second surface opposite the first surface; a pinned layer facing the first surface of the free layer; a first oxide layer disposed between the pinned layer and the free layer; and a second oxide layer disposed on the second surface of the free layer. The free layer includes a first free layer adjacent to the first oxide layer and a second free layer adjacent to the second oxide layer, and the first free layer includes a magnetic material not doped with/not including a non-magnetic metal, and the second free layer includes a magnetic material doped with/including the non-magnetic metal.

According to some example embodiments, a memory device includes a magnetic tunneling junction device and a plurality of memory cells each including a switching device connected to the magnetic tunneling junction device. The magnetic tunneling junction device includes a free layer having a first surface and a second surface opposite the first surface; a pinned layer facing the first surface of the free layer; a first oxide layer between the pinned layer and the free layer; and a second oxide layer on the second surface of the free layer. The free layer includes a magnetic material doped with/including a non-magnetic metal, and a concentration of the non-magnetic metal in the free layer is at a peak, e.g. a local or global minimum at the first surface and continuously varies from the first surface along the second surface.

According to some example embodiments, a method of fabricating a magnetic tunneling junction device may include provisioning a pinned layer; depositing a first oxide layer on the pinned layer; wetting a first surface of the first oxide layer with a wetting layer; performing at least one of a nitridation or an oxidation process of the first oxide layer to form at least one of nitrogen or oxygen on the first surface of the first oxide layer; depositing a free layer on the first surface of the first oxide layer; depositing a non-magnetic metal onto the free layer; depositing a second oxide layer on the free layer; and diffusing the at least one of the oxygen or nitrogen into the first oxide layer by annealing the free layer.

The wetting layer may include one or more materials selected from Fe, Co, Ni, Mn, a Fe-containing alloy, a Co-containing alloy, a Ni-containing alloy, and a Mn-containing alloy.

A thickness of the wetting layer may be less than or equal to three monolayers.

The depositing the free layer onto the first metal oxide layer may include depositing a first free layer onto the first metal oxide layer; and depositing a last free layer onto the first layer. The second oxide layer is deposited onto the last free layer.

The non-magnetic metal includes at least one of Mg, Ru, Ir, Ti, Zn, Ga, Ta, Al, Mo, Zr, Sn, W, Sb, V, Nb, Cr, Ge, Si, Hf, Tb, Sc, Y, Rh, In, Ca, Sr, Ba, Be, V, Mn, Li, Cd, Pb, Ga, and Mo.

BRIEF DESCRIPTION OF THE DRAWINGS

The above and other aspects, features, and advantages of certain example embodiments will be more apparent from the following description taken in conjunction with the accompanying drawings, in which.

DETAILED DESCRIPTION

Figure 1:
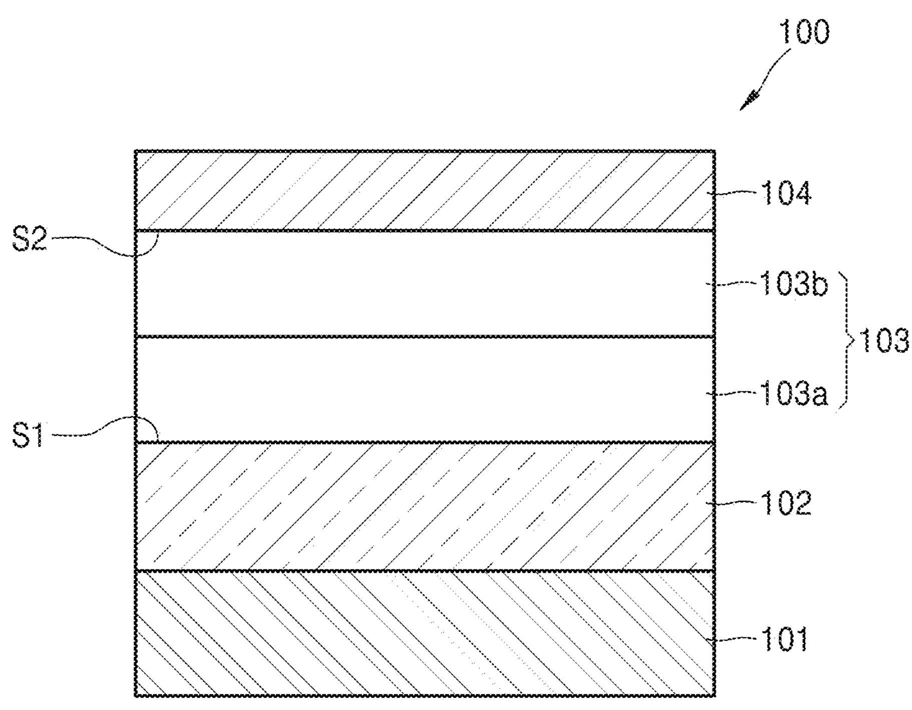
FIG. 1 is a cross-sectional view illustrating a schematic structure of a magnetic tunneling junction device according to some example embodiments.

Reference will now be made in detail to various embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, with reference to the accompanying drawings, a magnetic tunneling junction device and a memory device including the magnetic tunneling junction device will be described in detail. Like reference numerals refer to like elements throughout, and in the drawings, sizes of elements may be exaggerated for clarity and convenience of explanation. Various example embodiments described below are merely exemplary, and various modifications may be possible from example embodiments.

In a layer structure described below, an expression "above" or "on" may include not only "immediately on in a contact manner" but also "on in a non-contact manner". An expression used in the singular encompasses the expression of the plural, unless it has a clearly different meaning in the context. It will be further understood that the terms "comprises" and/or "comprising" used herein specify the presence of stated features or elements, but do not preclude the presence or addition of one or more other features or elements.

The use of "the" and other demonstratives similar thereto may correspond to both a singular form and a plural form. Unless the order of operations of a method according to the present disclosure is explicitly mentioned or described otherwise, the operations may be performed in a proper order. Example embodiments are not limited to the order the operations are mentioned.

The term used in various example embodiments such as "unit" or "module" indicates a unit for processing at least one function or operation, and may be implemented in hardware or software, or in a combination of hardware and software.

The connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language provided herein, is intended merely to better illuminate the disclosure and does not pose a limitation on the scope of the disclosure unless otherwise claimed.

FIG. 1 is a cross-sectional view illustrating a schematic structure of a magnetic tunneling junction device 100 according to some example embodiments. Referring to FIG. 1, the magnetic tunneling junction device 100 according to some example embodiments may include a pinned layer 101, a first oxide layer 102 disposed on the pinned layer 101, a free layer 103 disposed on the first oxide layer 102, and a second oxide layer 104 disposed on the free layer 103.

Here, the expression "disposed on" is for convenience of description and does not necessarily mean a vertical relationship. For example, the first oxide layer 102 may be disposed between the pinned layer 101 and the free layer 103, and the free layer 103 may be disposed between the first oxide layer 102 and the second oxide layer 104. The free layer 103 may include a first surface S1 and a second surface S2 that face each other. The pinned layer 101 may be disposed to face the first surface S1 of the free layer 103, and the second oxide layer 104 may be disposed on the second surface S2 of the free layer 103.

The pinned layer 101 and the free layer 103 may include a ferromagnetic metal material having magnetism, e.g. having magnetic properties. For example, the pinned layer 101 and the free layer 103 may include at least one ferromagnetic material selected from the group consisting of or including iron (Fe), cobalt (Co), nickel (Ni), manganese (Mn), a Fe-containing alloy, a Co-containing alloy, a Ni-containing alloy, an Mn-containing alloy and a Heusler alloy. The pinned layer 101 and the free layer 103 may include the same magnetic material and may or may not include any other material in common, but example embodiments are not limited thereto.

The pinned layer 101 may have a pinned magnetization direction, and the free layer 103 may have a variable magnetization direction. The magnetization direction of the free layer 103 may change/be induced to be changed due to a spin torque induced by a spin-polarized current applied to the free layer 103. The magnetic tunneling junction device 100 may have a relatively low resistance when the pinned layer 101 and the free layer 103 have the same magnetization direction (e.g. are parallel with one another), and a relatively high resistance when the magnetization directions are opposite (e.g. are antiparallel with one another). This phenomenon is called tunneling magnetoresistance (TMR). The magnetic tunneling junction device 100 may be used in a memory device by applying this TMR phenomenon.

The pinned layer 101 and the free layer 103 may have high perpendicular magnetic anisotropy (PMA). For example, the perpendicular magnetic anisotropy energy of the pinned layer 101 and the free layer 103 may exceed out-of-plane demagnetization energy. In this case, the magnetic moments of the pinned layer 101 and the free layer 103 may be stabilized in a direction perpendicular to a layer direction. The magnetic tunneling junction device 100 may be applied to STT-MRAM. Alternatively or additionally, the magnetic tunneling junction device 100 may be applied not only to STT-MRAM but also to spin-orbit coupling torque (SOT) MRAM.

The first oxide layer 102 disposed between the pinned layer 101 and the free layer 103 may serve as/correspond to/be configured to act as a tunnel barrier layer for a magnetic tunneling junction. The first oxide layer 102 may include crystalline Mg oxide. For example, the first oxide layer 102 may include one or more of MgO, $MgAl_2O_4$, or $MgTiO_x$. Alternatively or additionally, the second oxide layer 104 may serve as/correspond to/be configured to act as a capping layer. The second oxide layer 104 typically includes the same material as the first oxide layer 102, but is not necessarily limited thereto and may include any oxide material.

According to various example embodiments, the free layer 103 may include a first free layer 103*a* adjacent to the first oxide layer 102 and a second free layer 103*b* adjacent to the second oxide layer 104. For example, the first free layer 103*a* is a layer including the first surface S1 and may be disposed between the first oxide layer 102 and the second free layer 103*b*. The second free layer 103*b* is a layer including the second surface S2, and may be disposed between the first free layer 103*a* and the second oxide layer 104. The first free layer 103*a* and the second free layer 103*b* may be disposed to contact, e.g. to directly contact each other. The first free layer 103*a* may serve to or be configured to increase the tunneling magnetoresistance of the free layer 103 and/or to improve data retention. The second free layer 103*b* may reduce the saturation magnetization of the free layer 103 to improve the operating speed of the memory device using the magnetic tunneling junction device 100.

The operating speed of the memory device using the magnetic tunneling junction device 100 is affected by the saturation magnetization Ms of the free layer 103. For example, as or when the saturation magnetization Ms is low, the magnetization direction of the free layer 103 may be more easily changed even with a low current, and/or the operating speed of the memory device may be increased. Meanwhile, as or when the saturation magnetization Ms of the free layer 103 is low, the tunneling magnetoresistance may be reduced due to a decrease in the spin polarization. Alternatively or additionally, when the saturation magnetization Ms of the free layer 103 is low, data retention may be reduced due to a decrease in the magnetic exchange stiffness. In this respect, it may be seen that there may be a trade-off relationship between the operating speed of the memory device and data retention.

According to some example embodiments, the first free layer 103*a* in contact with the first oxide layer 102 providing the magnetic tunneling junction may be configured to have a high tunneling magnetoresistance, and the second free layer 103*b* away from the first oxide layer 102 may be configured to have a low saturation magnetization. Accordingly, a switching efficiency expressed as a ratio (retention/lsw) of the data retention and (retention) a switching current (lsw) may be improved, thereby improving performance, e.g. thereby reducing and/or minimizing the degradation of tunneling magnetoresistance and data retention while improving the operating speed of the memory device. Alternatively or additionally, the free layer 103 generally may have a low saturation magnetization, and thus the operating speed of the magnetic tunneling junction device 100 may be improved. For example, the operating speed and/or switching speed of the memory device including the magnetic tunneling junction device 100 according to various example embodiments may be less than or equal to 10 nsec.

The second free layer 103*b* may include a magnetic material doped with a non-magnetic metal, or having a non-magnetic metal incorporated therein, so as to reduce the saturation magnetization Ms. Meanwhile, the first free layer 103*a* may include a magnetic material that is not doped with or does not include a non-magnetic metal to have a high tunneling magnetoresistance. For example, the second free layer 103*b* may include CoFeX doped with a non-magnetic metal X, and the first free layer 103*a* may include CoFe. The non-magnetic metal (X) may include at least one metal selected from the group consisting of or including, for example, Mg, Ru, Ir, Ti, Zn, Ga, Ta, Al, Mo, Zr, Sn, W, Sb, V, Nb, Cr, Ge, Si, Hf, Tb, Sc, Y, Rh, In, Ca, Sr, Ba, Be, V, Mn, Li, Cd, Pb, Ga, and Mo. The doping concentration of the non-magnetic metal X in the second free layer 103*b* may be, for example, in a range of about 5 at % to about 50 at %. The first free layer 103*a* and the second free layer 103*b* may include various other ferromagnetic materials described above in addition to CoFe.

When reference is made to a first material doped with a second material, it may generally be understood that the first material has a portion of the second material included therein. The second material may be doped with the first material, for example, with a technique such as one or more of with a sputtering technique, a physical vapor deposition (PVD) technique; however, example embodiments are not limited thereto. At least some of the second material may be driven in, e.g. thermally driven in, to the first material; however, example embodiments are not limited thereto.

Alternatively or additionally, in order to improve a wetting property of the first free layer 103*a* during a process of depositing the first free layer 103*a* on the first oxide layer 102, the first free layer 103*a* may further include boron (B). For example, the first free layer 103*a* may include CoFeB. Boron may improve wetting properties of the first free layer 103*a* so that the first free layer 103*a* is more uniformly coated on an upper surface of the first oxide layer 102. Boron does not affect the tunneling magnetoresistance of a magnetic material. Meanwhile, when the non-magnetic metal and boron coexist in the magnetic material, the magnetic exchange stiffness of the magnetic material may be reduced, e.g. greatly reduced. Accordingly, the second free layer 103*b* may not include boron or may include boron at a concentration less than or significantly less that of the first free layer 103*a*. For example, the concentration of boron in the first free layer 103*a* may be in the range of about 5 at % to about 50 at %. The concentration of boron in the second free layer 103*b* may be equal to or less than ½ or equal to or less than ¼ of the concentration of boron of the first free layer 103*a*. For example, the concentration of boron in the second free layer 103*b* may be in the range of 0 at % to about 25 at %.

FIGS. 2A to 2E are cross-sectional views illustrating a process of manufacturing/fabricating the magnetic tunneling junction device 100 shown in FIG. 1. Hereinafter, a method of manufacturing the magnetic tunneling junction device 100 shown in FIG. 1 will be described with reference to FIGS. 2A to 2E.

Figure 2A:
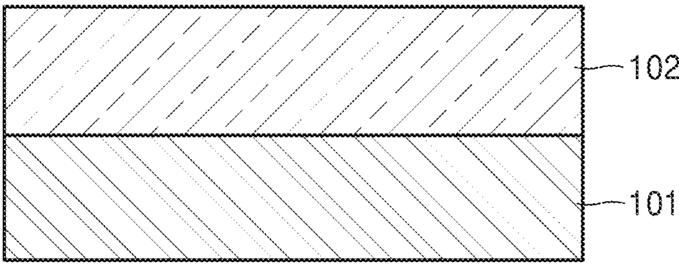
FIGS. 2A to 2E are cross-sectional views illustrating a process of manufacturing the magnetic tunneling junction device shown in FIG. 1 according to some example embodiments.

First, referring to FIG. 2A, the first oxide layer 102 is formed on the pinned layer 101 by depositing/growing/sputtering an oxide such as a metal oxide such as MgO, $MgAl_2O_4$, or $MgTiO_x$. For example, the first oxide layer 102 may be formed through radio frequency (RF) sputtering and/or through a chemical vapor deposition (CVD) process.

After the first oxide layer 102 is formed, the pinned layer 101 and the first oxide layer 102 may be cooled to a low temperature. In general, the material of the first oxide layer 102 has a relatively low surface energy, while the metal material of the free layer 103 has a relatively high surface energy. For this reason, when forming the free layer 103 on the first oxide layer 102, the metal material may not be evenly distributed on a surface of the first oxide layer 102. This problem may be improved by lowering the temperature of the first oxide layer 102 to deteriorate the mobility of the metal material. For example, the first oxide layer 102 may be cooled to a temperature less than or equal to about 250 K, or about 50 K to about 150 K, or about 70 K to about 100 K.

Figure 2B:
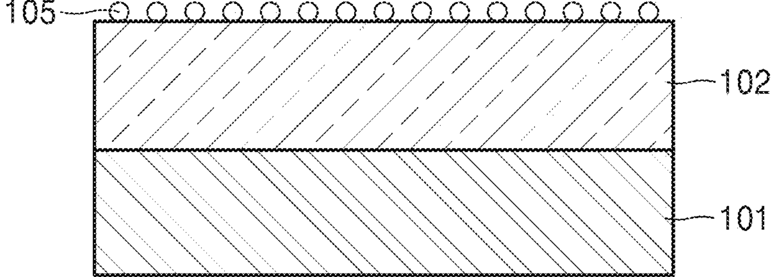

Referring to FIG. 2B, before forming the free layer 103, a wetting layer 105 may be first formed on the first oxide layer 102. The wetting layer 105 may serve to help deposit the free layer 103 on the first oxide layer 102 by increasing the surface energy of the first oxide layer 102. The wetting layer 105 may be formed by using a method such as sputtering and/or physical vapor deposition (PVD), etc. The wetting layer 105 may be used as a precursor with respect to the free layer 103. To this end, the wetting layer 105 may include a 3*d* transition metal and/or an alloy thereof. For example, the wetting layer 105 may include at least one material selected from the group consisting of or including Fe, Co, Ni, Mn, a Fe-containing alloy, a Co-containing alloy, a Ni-containing alloy, and a Mn-containing alloy.

The wetting layer 105 may have a very thin thickness. For example, the wetting layer 105 may include only two or three monolayers. Although the wetting layer 105 may be distributed substantially uniformly on the first oxide layer 102, because the wetting layer 105 has a very thin thickness, it is not necessary or required or significant to have a completely smooth and continuous distribution, and a void may be partially inside the wetting layer 105.

Figure 2C:
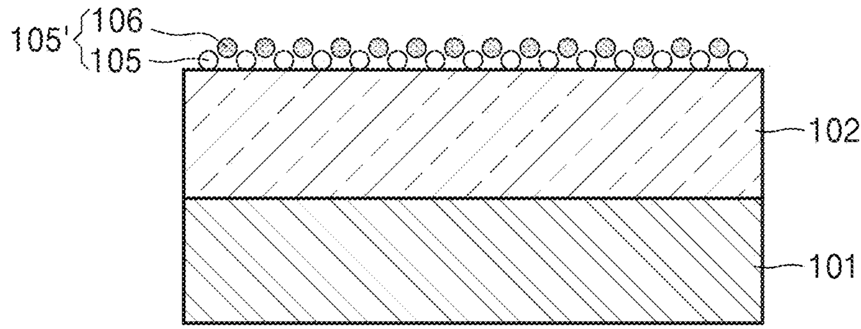

Referring to FIG. 2C, oxygen and/or nitrogen atoms 106 may be combined with the wetting layer 105 by oxidizing and/or nitriding the wetting layer 105. For example, the wetting layer 105 may be naturally/natively oxidized, and/or other oxidation methods such as reactive oxidation may be used. Alternatively or additionally, the wetting layer 105 may be nitrided naturally/natively, and/or through an intentional reaction such as with a decoupled plasma nitridation (DPN) process and/or within a process chamber; however, example embodiments are not limited thereto. This oxidation/nitridation reaction may be performed until a target resistance area (RA) product is achieved. Although the wetting layer 105 may be completely oxidized and/or nitrided through the oxidation/nitridation reaction, the oxidation/nitridation reaction may be terminated while the wetting layer 105 is not completely oxidized/nitrided. As a result, an oxidized/nitrided wetting layer 105' is formed on the first oxide layer 102.

Figure 2D:
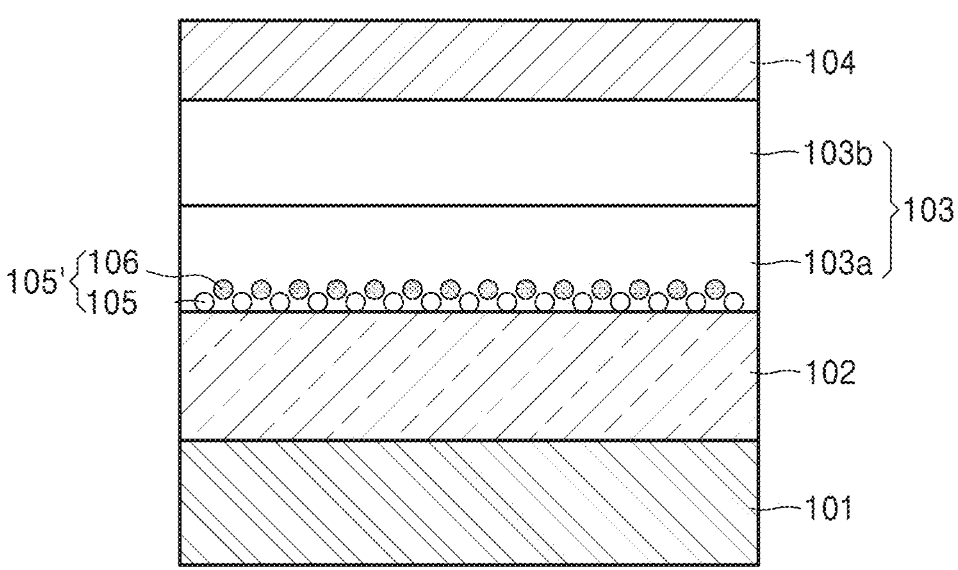

Referring to FIG. 2D, a free layer 103 may be deposited on the oxidized/nitrided wetting layer 105'. The free layer 103 may be deposited with, for example, a CVD process; however, example embodiments are not limited thereto. To this end, the first free layer 103*a* may be deposited on the oxidized/nitrided wetting layer 105'. In order to form the first free layer 103*a* on the oxidized/nitrided wetting layer 105', for example, at least one of 3*d* transition metals such as iron (Fe), cobalt (Co), nickel (Ni), and manganese (Mn), 3*d* transition metal alloys such as Fe-containing alloy, Co-containing alloy, Ni-containing alloy, and Mn-containing alloy, or Hausler alloy such as $Co_2Fe$, $Co_2MnSi$, $Co_2FeMnSi$, $Co_2FeSi$, MnGa, MnGe, etc. may be deposited and/or implanted. If necessary or significant or important, when forming the first free layer 103*a*, boron may be further provided in a chamber such as in a plasma chamber and/or with an ion implantation process. Boron may facilitate the formation of the first free layer 103*a* on the first oxide layer 102 by reducing the surface energy of the first free layer 103*a*. Thereafter, a last free layer, such as the second free layer 103*b* may be deposited on the first free layer 103*a*. As described above, the second free layer 103*b* may be doped with non-magnetic metal other than boron. A thickness of the second free layer 103*b* may be the same as or different from (e.g. less than or greater than) a thickness of the first free layer 103*a*.

In an operation of forming the free layer 103, the first oxide layer 102 may still be in a cryogenic cooling state. This may be because a time from cooling the first oxide layer 102 to depositing the free layer 103 may be considerably shorter than a time taken for the temperature of the first oxide layer 102 to naturally rise to room temperature Even though the temperature of the first oxide layer 102 naturally rises, the temperature of the first oxide layer 102 in the operation of forming the free layer 103 may be equal to or less than 300 K, for example, less than or equal to 250 K. Alternatively, when the deposition of the free layer 103 starts, the temperature of the first oxide layer 102 may be less than or equal to 200 K. If necessary or desirable, additional cooling may be performed before depositing the free layer 103 after forming the oxidized/nitrided wetting layer 105'.

After the free layer 103 is formed, a second oxide layer 104 may be further formed on the free layer 103, for example by a process such as by a CVD process and/or an atomic layer deposition (ALD) process. The second oxide layer 104 may or may not include the same oxide material as the first oxide layer 102, and/or may include other oxide materials.

Figure 2E:
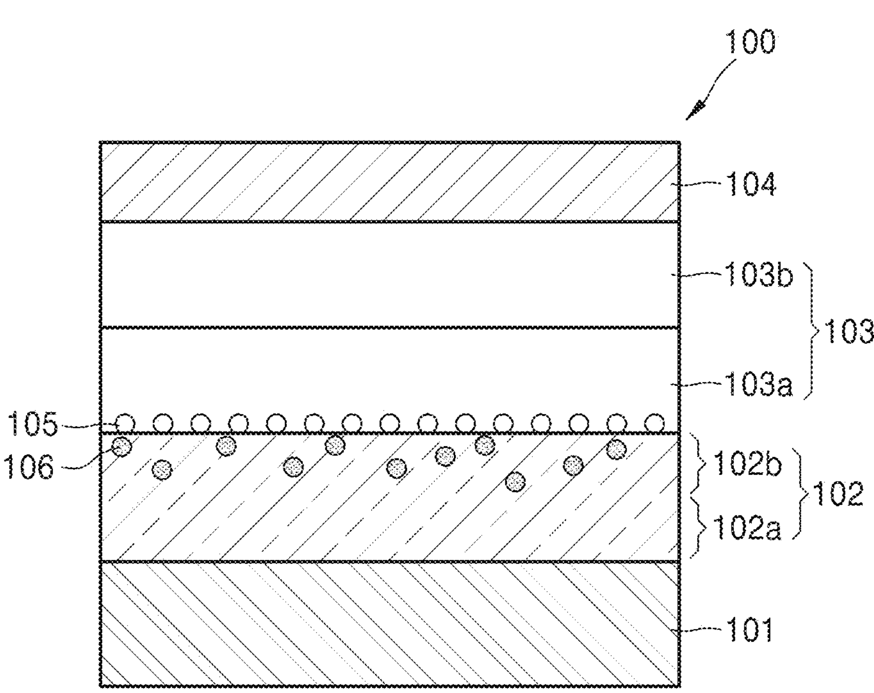

Referring to FIG. 2E, in order to improve the crystallinity of the free layer 103, the free layer 103 may be annealed at a temperature greater than or equal to a room temperature (300 K). For example, rapid thermal annealing (RTA) may be performed. During an annealing process, oxygen and/or nitrogen atoms 106 combined with the oxidized/nitrided wetting layer 105' may diffuse (thermally diffuse) into the first oxide layer 102. The wetting layer 105 from which the oxygen and/or nitrogen atoms 106 have escaped may be fused into the free layer 103 to be virtually indistinguishable from the free layer 103. The oxygen and/or nitrogen atoms 106 in the oxidized/nitrided wetting layer 105' may diffuse into the first oxide layer 102 so that a proportion of oxygen or nitrogen in a region of the first oxide layer 102 adjacent to the free layer 103 may increase. Accordingly, after the operation shown in FIG. 2E, the first oxide layer 102 may include a first region 102*a* adjacent to the pinned layer 101 and a second region 102*b* adjacent to the free layer 103, and a proportion of oxygen or nitrogen in the second region 102*b* may be greater than a proportion of oxygen or nitrogen in the first region 102*a*. A profile of oxygen or nitrogen within the first oxide layer 102 may show a peak within the second region 102*b* that is more than a profile of concentration of oxygen or nitrogen within the first region 102*a*.

In some example embodiments, the first oxide layer 102 may include a metal oxide having a stoichiometrically oxygen-deficient composition, so as to more easily trap oxygen or nitrogen generated in an annealing process. For example, when the first oxide layer 102 includes MgO, a proportion of magnesium (Mg) in the first oxide layer 102 may be greater than 50 at % and a proportion of oxygen (O) in the first oxide layer 102 may be less than 50 at %. For example, the first oxide layer 102 may be formed so as to have an oxygen-deficient composition, as compared to an inherent oxygen composition of an oxide material forming the first oxide layer 102.

Meanwhile, during the annealing process, non-magnetic metal in the second free layer 103*b* diffuses to another layer, so that the concentration of the non-magnetic metal in each of the first free layer 103*a* and the second free layer 103*b* may not be constant, and may change gradually and/or continuously. For example, when the non-magnetic metal in the second free layer 103*b* diffuses toward the first oxide layer 102, the non-magnetic metal may also exist in the first free layer 103*a*. The concentration of the non-magnetic metal in the first free layer 103*a* may gradually increase in an interface direction with the second free layer 103*b* from the first oxide layer 102, and may be peaked, e.g. locally or globally maximum at the interface with the second free layer 103*b*. In addition, when the non-magnetic metal in the second free layer 103*b* generally moves toward the first oxide layer 102, the concentration of the non-magnetic metal in the second free layer 103*b* may be peaked, e.g. may be locally or globally maximum at the interface with the first free layer 103*a* and may be gradually reduced toward the second oxide layer 104. Accordingly, the concentration of the non-magnetic metal in the free layer 103 may be maximum or peaked at the interface between the first free layer 103*a* and the second free layer 103*b*, and may be gradually reduced in a direction of the first oxide layer 102 and the second oxide layer 104. However, the concentration of the non-magnetic metal in the first free layer 103*a* and the concentration of the non-magnetic metal in the second free layer 103*b* need not be continuous at the interface between the first free layer 103*a* and the second free layer 103*b* and may be discontinuous.

Alternatively or additionally, when, among non-magnetic metals in the second free layer 103*b*, a non-magnetic metal close to the first oxide layer 102 diffuses more toward the first oxide layer 102 and a non-magnetic metal close to the second oxide layer 104 diffuses less, the concentration of the non-magnetic metal in the second free layer 103*b* may be peaked/maximum at the interface with the second oxide layer 104.

Alternatively or additionally, the non-magnetic metal in the second free layer 103*b* may also diffuse into the second oxide layer 104. In this case, a part of the non-magnetic metal in the second free layer 103*b* close to the first free layer 103*a* may move toward the first free layer 103*a* and a part of the non-magnetic metal in the second free layer 103*b* close to the second oxide layer 104 may move toward the second oxide layer 104. Then, the concentration of the non-magnetic metal may be peaked/maximum at a central point such as at a midpoint of the second free layer 103*b* between the first free layer 103*a* and the second oxide layer 104, and the concentration of the non-magnetic metal may be gradually reduced from the central point of the second free layer 103*b* in a direction of the first free layer 103*a* and in a direction of the second oxide layer 104.

The direction and degree of the non-magnetic metal diffusing in the second free layer 103*b* may vary according to characteristics such as oxygen affinity of the non-magnetic metal, and/or according to absorption characteristics of the first and second oxide layers 102 and 104 with respect to the non-magnetic metal. Accordingly, the concentration distribution of the non-magnetic metal in the first free layer 103*a* and the second free layer 103*b* described above may be determined according to one or more of the material of the non-magnetic metal, the material of the first oxide layer 102, and the material of the second oxide layer 104.

Figure 3:
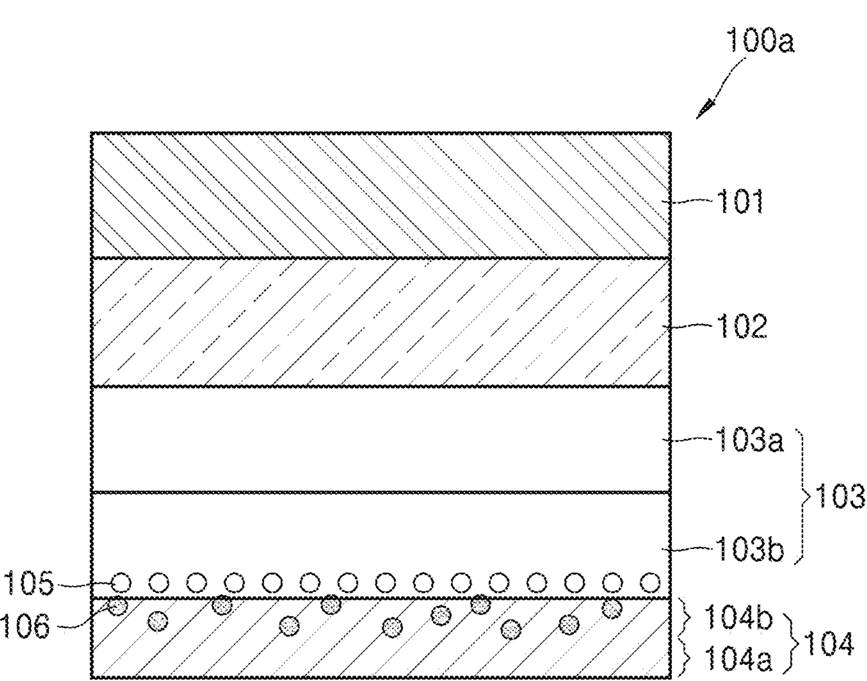
FIG. 3 is a cross-sectional view illustrating a schematic structure of a magnetic tunneling junction device according to some example embodiments.

FIG. 3 is a cross-sectional view showing a schematic structure of a magnetic tunneling junction device 100*a* according to various example embodiments. In FIGS. 2A to 2E, the first oxide layer 102, the first free layer 103*a*, the second free layer 103*b*, and the second oxide layer 104 are sequentially stacked on the pinned layer 101. However, a manufacturing/fabrication process of the magnetic tunneling junction device 100 is not necessarily limited thereto. For example, referring to FIG. 3, the magnetic tunneling junction device 100*a* may be manufactured by sequentially stacking the second free layer 103*b*, the first free layer 103*a*, the first oxide layer 102, and the pinned layer 101 on the second oxide layer 104. The magnetic tunneling junction device 100*a* shown in FIG. 3 differs from the magnetic tunneling junction device 100 shown in FIG. 1 only in the stacking order, and other configurations may be similar/substantially similar.

In the process of manufacturing the magnetic tunneling junction device 100*a* shown in FIG. 3, the wetting layer 105 and the oxygen and/or nitrogen atoms 106 bonded to the wetting layer 105 may be formed on an upper surface of the second oxide layer 104. Alternatively or additionally, oxygen and/or nitrogen generated during an annealing process may diffuse into the second oxide layer 104. In this case, the second oxide layer 104 may include a first region 104*a* having a relatively low oxygen (respectively, nitrogen) ratio and a second region 104*b* having a relatively high oxygen (respectively, nitrogen) ratio. The second region 104*b* is a region disposed adjacent to the second free layer 103*b*. In order for the second oxide layer 104 to capture oxygen and/or nitrogen more easily, the second oxide layer 104 may include a metal oxide having a stoichiometrically oxygen-deficient composition.

Figure 4:
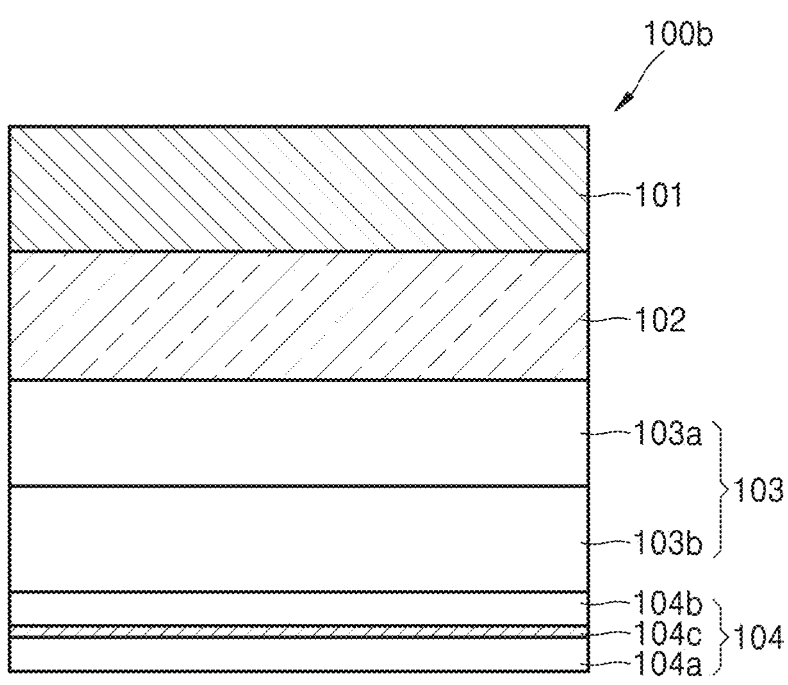
FIG. 4 is a cross-sectional view illustrating a schematic structure of a magnetic tunneling junction device according to some example embodiments.

FIG. 4 is a cross-sectional view showing a schematic structure of a magnetic tunneling junction device 100*b* according to various example embodiments. Referring to FIG. 4, the magnetic tunneling junction device 100*b* may include the second oxide layer 104, the second free layer 103*b* disposed on the second oxide layer 104, the first free layer 103*a* disposed on the second free layer 103*b*, the first oxide layer 102 disposed on the first free layer 103*a*, and the pinned layer 101 disposed on the first oxide layer 102. The second oxide layer 104 may further include a metal layer 104*c* therein to more easily trap oxygen or nitrogen generated during an annealing process. For example, the second oxide layer 104 includes the first region 104*a* having a relatively low oxygen and/or nitrogen ratio, the second region 104*b* having a relatively high oxygen and/or nitrogen ratio, and a metal layer 104*c* disposed between the first region 104*a* and the second region 104*b*.

Due to the metal layer 104*c*, the second oxide layer 104 may trap more oxygen and/or nitrogen atoms, and may further reduce oxygen and/or nitrogen atoms diffusing into the free layer 103. In particular, even when a non-magnetic metal in the second free layer 103*b* in direct contact with the second oxide layer 104 has an oxygen affinity greater than that of a ferromagnetic material, oxygen and/or nitrogen atoms may diffuse into the second oxide layer 104 without or with reduced diffusing into the second free layer 103*b*. Accordingly, an increase in a resistance area (RA) product of the magnetic tunneling junction device 100*b* due to the oxygen and/or nitrogen atoms diffused into the second free layer 103*b* may be prevented or reduced in likelihood of occurrence and/or impact, and a non-magnetic metal with a relatively high oxygen affinity can be doped on/incorporated in or on the magnetic material of the second free layer 103*b*. The metal layer 104*c* may also be applied to the first oxide layer 102 of the magnetic tunneling junction device 100 shown in FIG. 1.

Figure 5:
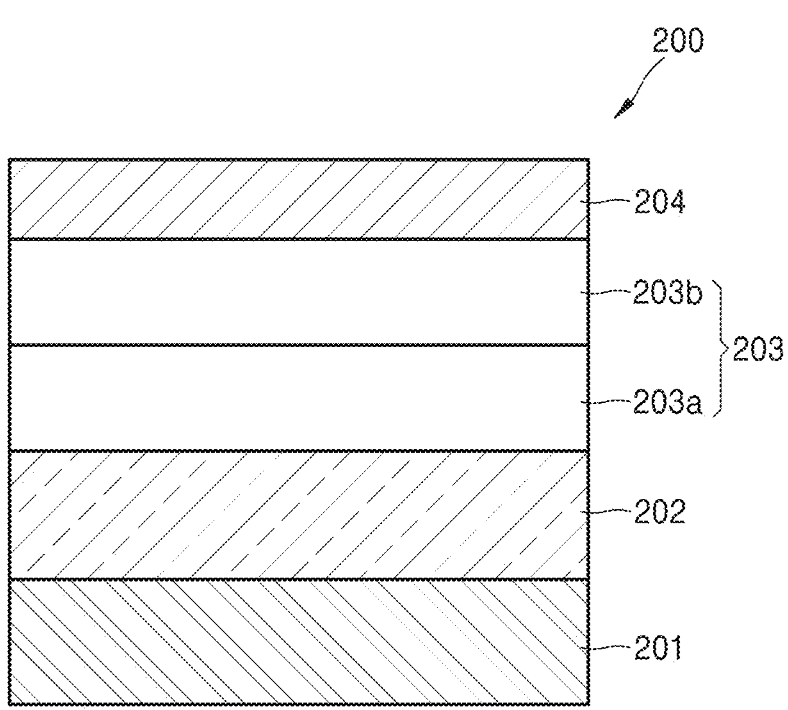
FIG. 5 is a cross-sectional view illustrating a schematic structure of a magnetic tunneling junction device according to some example embodiments.

FIG. 5 is a cross-sectional view showing a schematic structure of a magnetic tunneling junction device 200 according to various example embodiments. Referring to FIG. 5, the magnetic tunneling junction device 200 may include a pinned layer 201, a first oxide layer 202 disposed on the pinned layer 201, a free layer 203 disposed on the first oxide layer 202, and a second oxide layer 204 disposed on the free layer 203. The free layer 203 may include a first free layer 203*a* disposed on the first oxide layer 202, and a second free layer 203*b* disposed on the first free layer 203*a*. The pinned layer 201, the first oxide layer 202, and the free layer 203 of the magnetic tunneling junction device 200 shown in FIG. 5 have the same configurations as those of the pinned layer 101, the first oxide layer 102, and the free layer 103 of the magnetic tunneling junction device 100 shown in FIG. 1.

The second oxide layer 204 disposed on the second free layer 203*b* may include an oxide material different from the first oxide layer 202. For example, the first oxide layer 202 may include MgO while the second oxide layer 204 may not include MgO. In particular, the second oxide layer 204 may include an oxide material having an absorptivity to boron, in order to absorb the boron in the second free layer 203*b*. For example, the second oxide layer 204 may include at least one selected from the group consisting of or including HfOx, NbOx, TaOx, and WOx. Even when the material of the second free layer 203*b* does not include boron when the second free layer 203*b* is formed, boron in the first free layer 203*a* may diffuse into the second free layer 203*b* during an annealing process described with reference to FIG. 2E. The second oxide layer 204 may further reduce the concentration of boron in the second free layer 203*b* by absorbing boron in the second free layer 203*b*. Accordingly, a reduction in magnetic exchange stiffness of the second free layer 203*b* may be prevented or reduced in likelihood of occurrence and/or impact. Meanwhile, the second oxide layer 204 after annealing may further include boron absorbed from the second free layer 203*b* in addition to the above-described oxide material. As compared with a non-annealing oxide formation process, there may be a larger saturation of magnetization, indicating that boron has diffused to or is absorbed from the second free layer.

Alternatively or additionally, during the annealing process, boron in the first free layer 203*a* and the second free layer 203*b* diffuses into the second oxide layer 204, so that the concentration of boron in each of the first free layer 203*a* and the second free layer 203*b* is not constant, and may change gradually and continuously. For example, the concentration of boron in the first free layer 203*a* may be peaked, e.g. at a maximum at the interface with the first oxide layer 202 and be gradually reduced toward the second free layer 203*b*. Also, the concentration of boron in the second free layer 203*b* is peaked/maximum at the interface with the first free layer 203*a* and may be gradually reduced toward the second oxide layer 204. However, the concentration of boron in the first free layer 203*a* and the concentration of boron in the second free layer 203*b* may not be continuous at the interface between the first free layer 203*a* and the second free layer 203*b*, and may be discontinuous.

Figure 6:
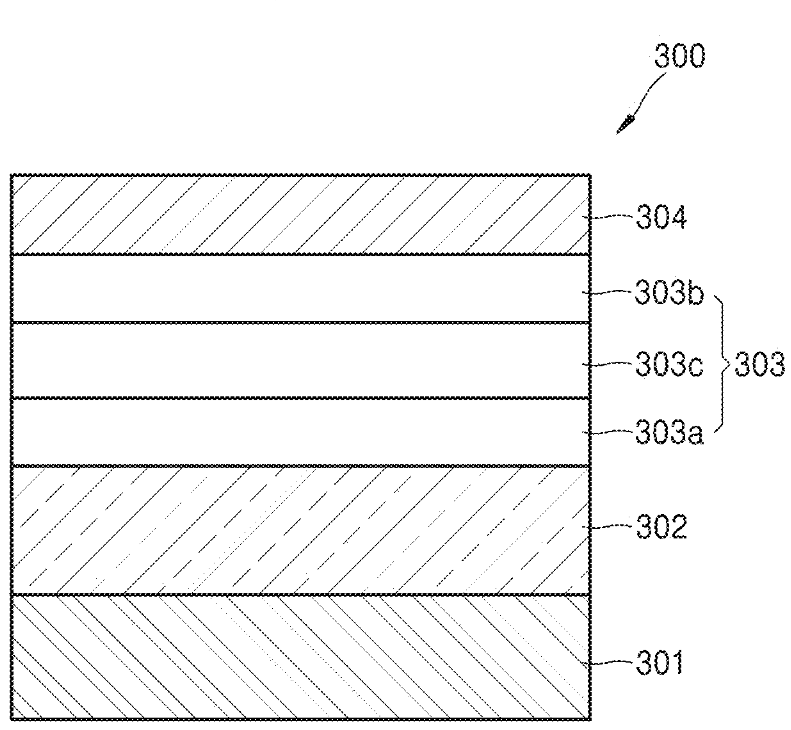
FIG. 6 is a cross-sectional view illustrating a schematic structure of a magnetic tunneling junction device according to some example embodiments.

FIG. 6 is a cross-sectional view showing a schematic structure of a magnetic tunneling junction device 300 according to some example embodiments. Referring to FIG. 6, the magnetic tunneling junction device 300 may include a pinned layer 301, a first oxide layer 302, a free layer 303, and a second oxide layer 304. The pinned layer 301, the first oxide layer 302, and the second oxide layer 304 of the magnetic tunneling junction device 300 shown in FIG. 6 may have the same configurations as those of the pinned layer 101, and the first oxide layer 102, and the second oxide layers 104 and 204 of the magnetic tunneling junction devices described above.

The free layer 303 of the magnetic tunneling junction device 300 shown in FIG. 6 may include a first free layer 303*a* adjacent to the first oxide layer 302, a second free layer 303*b* adjacent to the second oxide layer 304, and a third free layer 303*c* disposed between the first free layer 303*a* and the second free layer 303*b*. The first free layer 303*a* may be in contact with, e.g. in direct contact with a first surface of the third free layer 303*c*, and a second surface opposite to the first surface of the third free layer 303*c* may be in contact with, e.g. in direct contact with the second free layer 303*b*. The first free layer 303*a* may include a magnetic material that is not doped with a non-magnetic metal. The second free layer 303*b* and the third free layer 303*c* may include a magnetic material doped with a non-magnetic metal. The second free layer 303*b* and the third free layer 303*c* may have different doping concentrations. For example, the doping concentration of the non-magnetic metal in the second free layer 303*b* adjacent to the second oxide layer 304 may be greater than the doping concentration of the non-magnetic metal in the third free layer 303*c* adjacent to the first free layer 303*a*. For example, the doping concentration of the non-magnetic metal in the third free layer 303*c* may be in the range of about 5 at % to about 25 at %, and the doping concentration of the non-magnetic metal in the second free layer 303*b* may be in the range of about 25 at % to about 50 at %.

A thickness of each of the first free layer 303*a*, the second free layer 303*b*, and the third free layer 303*c* may be the same as each other; however, example embodiments are not limited thereto. For example, a thickness of any of the first to third free layers 303*a* to 303*c* may be different than any other of the first to third free layers 303*a* to 303*c*. A total thickness of the first free layer 303*a*, the second free layer 303*b*, and the third free layer 303*c* may be between 1 nanometer to a few nanometers, such as a half-dozen nanometers; however, example embodiments are not limited thereto, Also, the first free layer 303*a* may include boron. The third free layer 303*c* may include boron at a concentration less than that of the first free layer 303*a*, and the second free layer 303*b* may include boron at a concentration less than that of the third free layer 303*c* or may not include boron. For example, the concentration of boron in the first free layer 303*a* may be in the range of about 5 at % to about 50 at %, the concentration of boron in the third free layer 303*b* may be in the range of about 1 at % to about 25 at %, and the concentration of boron in the second free layer 303*b* may be in the range of 0 at % to about 15 at %.

Meanwhile, the second free layer 303*b* and the third free layer 303*c* may be doped with different non-magnetic metals, and may not be doped with the same magnetic materials. For example, a non-magnetic metal doped into the second free layer 303*b* and the third free layer 303*c* may be selected such that a decrease in saturation magnetization in the second free layer 303*b* having a relatively lower boron concentration is greater than a decrease in the saturation magnetization in the third free layer 303*c* having a relatively greater boron concentration.

Alternatively or additionally, as described above, the boron and the non-magnetic metal in the free layer 303 diffuse during the annealing process, and thus the concentration of boron and the concentration of the non-magnetic metal in each of the first to third free layers 303*a*, 303*b*, and 303*c* may be changed gradually.

Figure 7:
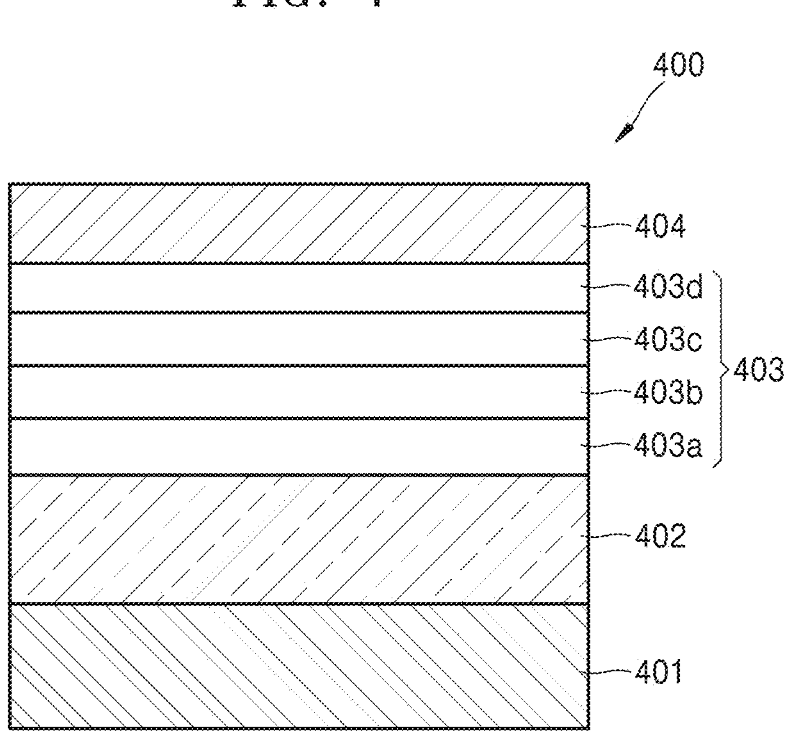
FIG. 7 is a cross-sectional view illustrating a schematic structure of a magnetic tunneling junction device according to some example embodiments.

FIG. 7 is a cross-sectional view showing a schematic structure of a magnetic tunneling junction device 400 according to some example embodiments. Referring to FIG. 7, the magnetic tunneling junction device 400 may include a pinned layer 401, a first oxide layer 402, a free layer 403, and a second oxide layer 404. The pinned layer 401, the first oxide layer 402, and the second oxide layer 404 of the magnetic tunneling junction device 400 shown in FIG. 7 may have the same configurations as those of the pinned layer 101, and the first oxide layer 102, and the second oxide layers 104 and 204 of the magnetic tunneling junction devices described above.

In FIG. 6, the free layer 303 includes three discontinuous layers, but is not necessarily limited thereto. The free layer 403 of the magnetic tunneling junction device 400 shown in FIG. 7 may include a first free layer 403*a*, a second free layer 403*b*, a third free layer 403*c*, and a fourth free layer 403*d* sequentially arranged from the first oxide layer 402 toward the second oxide layer 404. The first free layer 403*a* may include a magnetic material not doped with a non-magnetic metal, and the second to fourth free layers 403*b*, 403*c*, and 403*d* may include a magnetic material doped with a non-magnetic metal at different doping concentrations. For example, the doping concentration of the non-magnetic metal in the third free layer 403*c* may be greater than the doping concentration of the non-magnetic metal in the second free layer 403*b* and the doping concentration of the non-magnetic metal in the fourth free layer 403*d* may be greater than the doping concentration of the non-magnetic metal in the third free layer 403*c*. For example, the closer to the second oxide layer 404, the greater the doping concentration may be.

A thickness of any of the first to fourth free layers 403*a* to 403*d* may be the same, or at least one of the first to fourth free layers 403*a* to 403*d* may have a thickness different than others of the first to fourth free layers 403*a* to 403*d*.

The first free layer 403*a* may include boron at the highest concentration, the second free layer 403*b* may include boron at a lower concentration than the first free layer 403*a*, the third free layer 403*c* may include boron at a lower concentration than the second free layer 403*b*, and the fourth free layer 403*d* may include boron at a lower concentration than the third free layer 403*c* or may not include boron. For example, the closer to the first oxide layer 402, the greater the concentration of boron, and the closer to the second oxide layer 404, the lower the concentration of boron.

Figure 8:
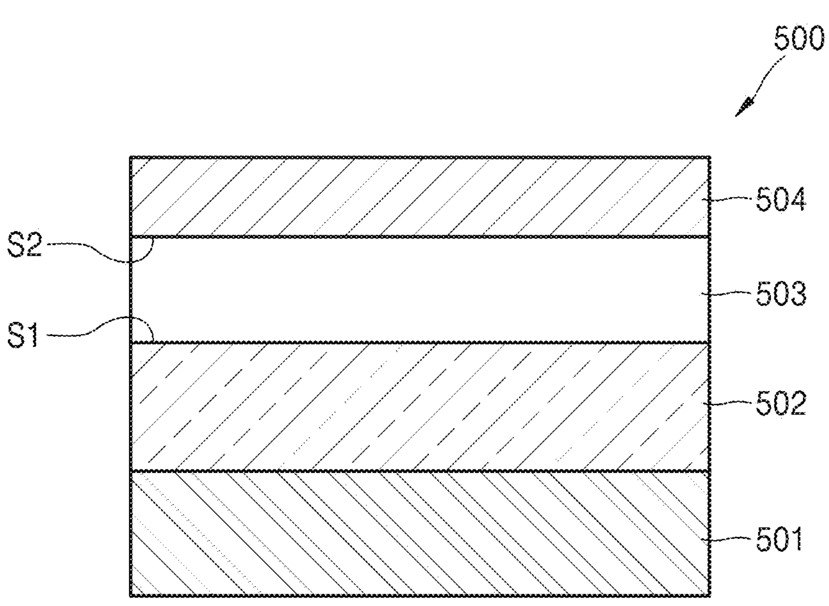
FIG. 8 is a cross-sectional view illustrating a schematic structure of a magnetic tunneling junction device according to some example embodiments.

FIG. 8 is a cross-sectional view showing a schematic structure of a magnetic tunneling junction device 500 according to some example embodiments. Referring to FIG. 8, the magnetic tunneling junction device 500 may include a pinned layer 501, a first oxide layer 502, a free layer 503, and a second oxide layer 504. The free layer 503 may include the first surface S1 and the second surface S2 that face each other. The first surface S1 is disposed in contact with the first oxide layer 502 and the second surface S2 is in contact with the second oxide layer 504. The pinned layer 501, the first oxide layer 502, and the second oxide layer 504 of the magnetic tunneling junction device 500 shown in FIG. 8 may have the same configurations as those of the pinned layer 101, and the first oxide layer 102, and the second oxide layers 104 and 204 of the magnetic tunneling junction devices described above.

Up to now, it has been described that a free layer includes a plurality of layers having a discontinuous composition, e.g. having layers deposited at discontinuous times. However, the magnetic tunneling junction device 500 shown in FIG. 8 may include one free layer 503 having a continuously changed composition. For example, the concentration of boron in the free layer 503 may be gradually and continuously reduced from the first surface S1 adjacent to the first oxide layer 502 toward the second surface S2 adjacent to the second oxide layer 504. For example, the concentration of boron may be highest near an interface with the first oxide layer 502 and the concentration of boron may be lowest near an interface with the second oxide layer 504.

Also, the doping concentration of the non-magnetic metal in the free layer 503 may be continuously and/or gradually changed from the first surface S1 to the second surface S2. For example, the free layer 503 may be formed such that the doping concentration of the non-magnetic metal in the free layer 503 is small, e.g. minimum at or near the first surface S1 that is the interface with the first oxide layer 502. A point at which the doping concentration of the non-magnetic metal is maximum in the free layer 503 may vary depending on a direction and a degree of diffusion of the non-magnetic metal during an annealing process. For example, when, among non-magnetic metals in the free layer 503, a non-magnetic metal close to the first oxide layer 502 more diffuses toward the first oxide layer 502 and non-magnetic metal close to the second oxide layer 504 less diffuses, the concentration of the non-magnetic metal in the free layer 503 may be large, e.g. maximum at or near the second surface S2 that is the interface with the second oxide layer 504. In this case, the concentration of the non-magnetic metal may continuously and gradually increase from the first surface S1 to the second surface S2.

Alternatively or additionally, when the non-magnetic metal in the free layer 503 diffuses into the second oxide layer 504, a part of the non-magnetic metal in the free layer 503 close to the first oxide layer 502 may move toward the first oxide layer 502 and a part of the non-magnetic metal in the free layer 503 close to the second oxide layer 504 may move toward the second oxide layer 504. Then, the concentration of the non-magnetic metal may be maximum in a central region, e.g. at a midpoint of the free layer 503 close to the second oxide layer 504. For example, the concentration of the non-magnetic metal may be peaked/maximum at a distance from the first surface S1 to about ⅔ to about ⅘ of the total thickness of the free layer 503. For example, when the total thickness of the free layer 503 is about 4 nm/40 Å, the concentration of the non-magnetic metal may be maximum at a distance between about 2.6 nm (26 Å) and about 3.2 nm (32 Å) from the first surface S1. In addition, the concentration of the non-magnetic metal in the free layer 503 may be continuously and gradually reduced from a peak/maximum point in a direction of the first surface S1 and in a direction of the second surface S2.

Figure 9:
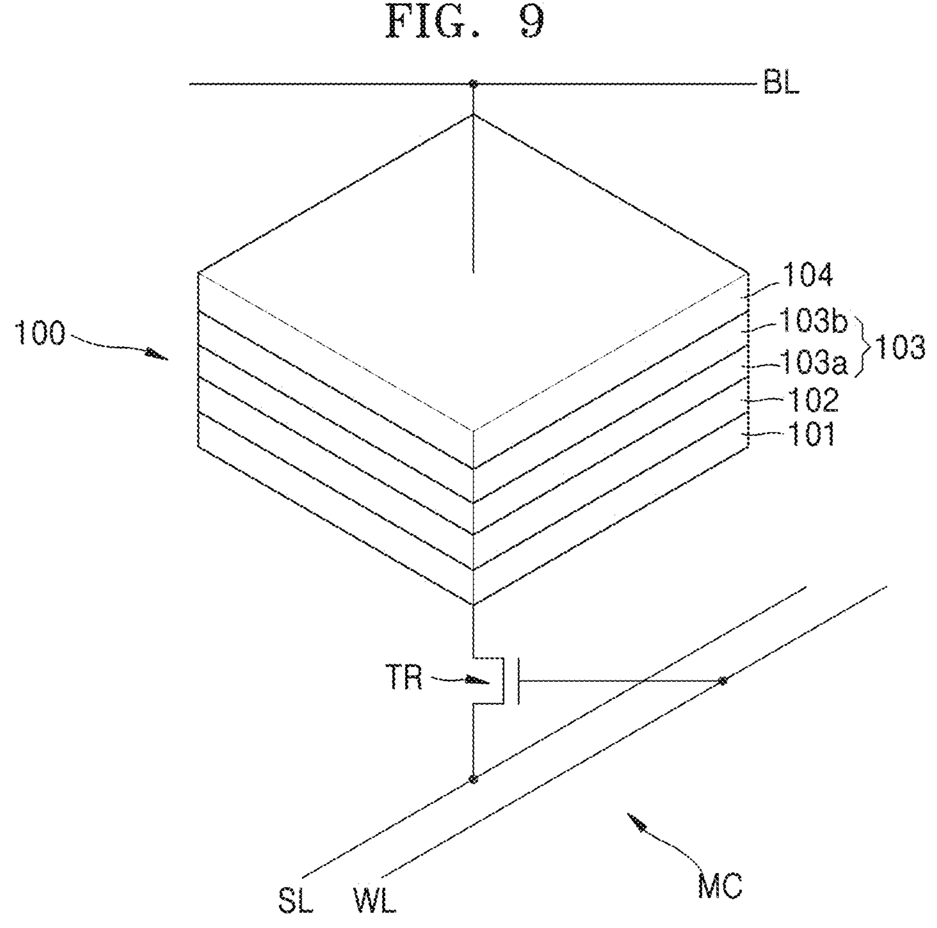
FIG. 9 schematically shows one memory cell including a magnetic tunneling junction device according to some example embodiments.

FIG. 9 schematically shows one memory cell including the magnetic tunneling junction device 100 according to some example embodiments. Referring to FIG. 9, the memory cell MC may include the magnetic tunneling junction device 100 and a switching device TR connected to the magnetic tunneling junction device 100. The switching device TR may be a transistor such as a thin film transistor. The memory cell MC may be connected between a bit line BL and a word line WL. The bit line BL and the word line WL may be disposed to cross each other, and the memory cell MC may be disposed in an intersection point of the bit line BL and the word line WL. The bit line BL may be electrically connected to the free layer 103 of the magnetic tunneling junction device 100 and the word line WL may be connected to a gate of the switching device TR. In addition, a first source/drain electrode of the switching device TR may be electrically connected to the pinned layer 101 of the magnetic tunneling junction device 100 and a second source/drain electrode of the switching device TR may be electrically connected to a selection line SL. In this structure, one or more of a write current, a read current, an erase current, etc. may be applied to the memory cell MC through the word line WL and the bit line BL. In FIG. 9, it is shown that the memory cell MC includes the magnetic tunneling junction device 100 shown in FIG. 1, but example embodiments are not limited thereto, and the memory cell MC may include a magnetic tunneling junction device such as one or more of the magnetic tunneling junction devices 200-500.

Figure 10:
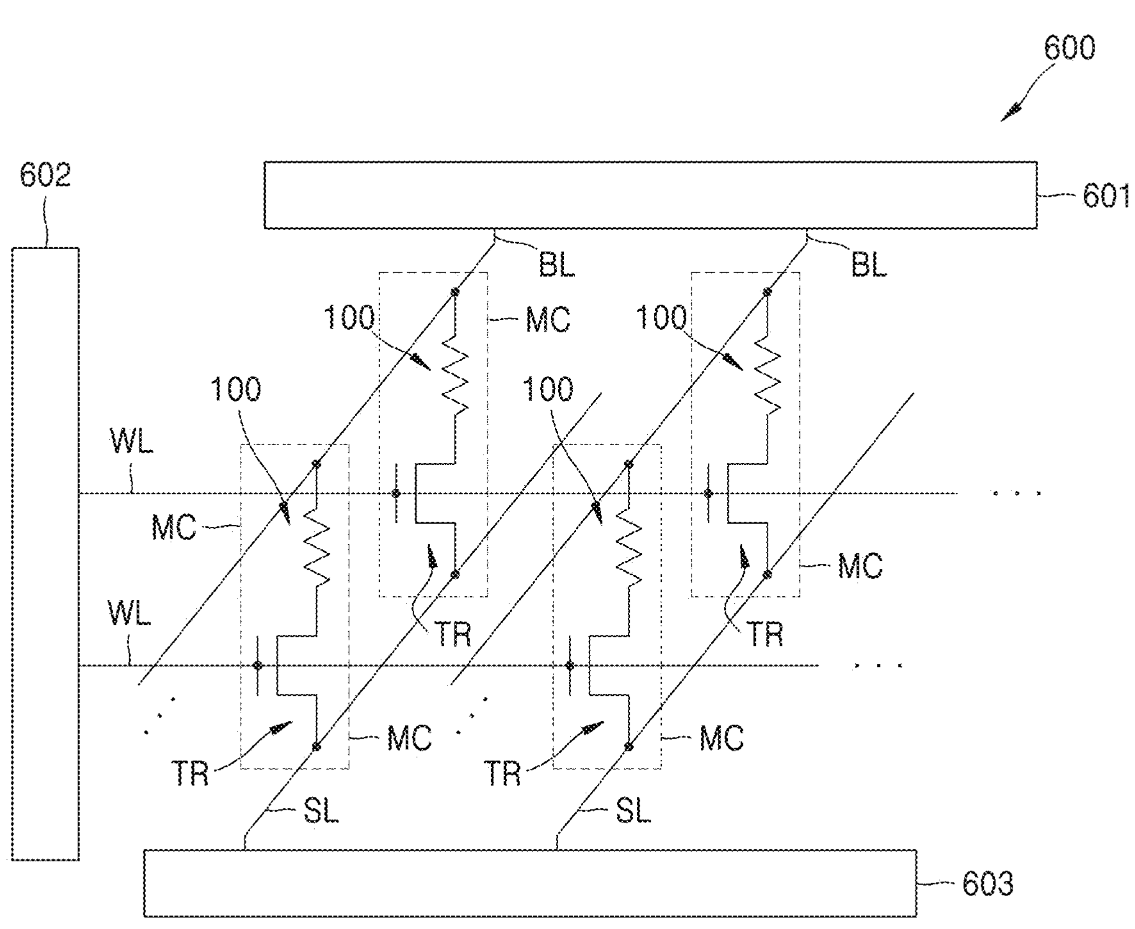
FIG. 10 is a circuit diagram schematically illustrating a configuration of a memory device including a plurality of memory cells shown in FIG. 9.

FIG. 10 is a circuit diagram schematically illustrating a configuration of a memory device 600 including the plurality of memory cells MCs shown in FIG. 9. Referring to FIG. 10, the memory device 600 may include a plurality of bit lines BL, a plurality of word lines WL, a plurality of selection lines SL, the plurality of memory cells MCs respectively disposed in intersection points of the plurality of bit lines BL and the plurality of word lines WL, a bit line driver 601 applying current to the plurality of bit lines BL, a word line driver 602 applying current to the plurality of word lines WL and a selection line driver 603 applying current to the plurality of selection lines SL. Each memory cell MC may have the configuration shown in FIG. 9; however, example embodiments are not limited thereto. For example, some of the memory cells MC may have a configuration including one or more of the magnetic tunneling junction devices 100-500, and others of the memory cells MC may have a configuration including one or more others of the magnetic tunneling junction devices 100-500.

The memory device 600 illustrated in FIG. 10 may be or may include a magnetic random access memory (MRAM), and may be used in electronic devices using nonvolatile memory. For example, the memory device 600 illustrated in FIG. 10 may be an STT-MRAM in which a magnetization direction of a free layer is changed by a spin current directly applied to the free layer of the magnetic tunneling junction device. The STT-MRAM does not require or use a separate wire for generating an external magnetic field, and thus the STT-MRAM may be advantageous for high integration and/or may have a simple operation method. Although the STT-MRAM is shown as an example in FIG. 10, the magnetic tunneling junction device may be applied to SOT-MRAM.

Figure 11:
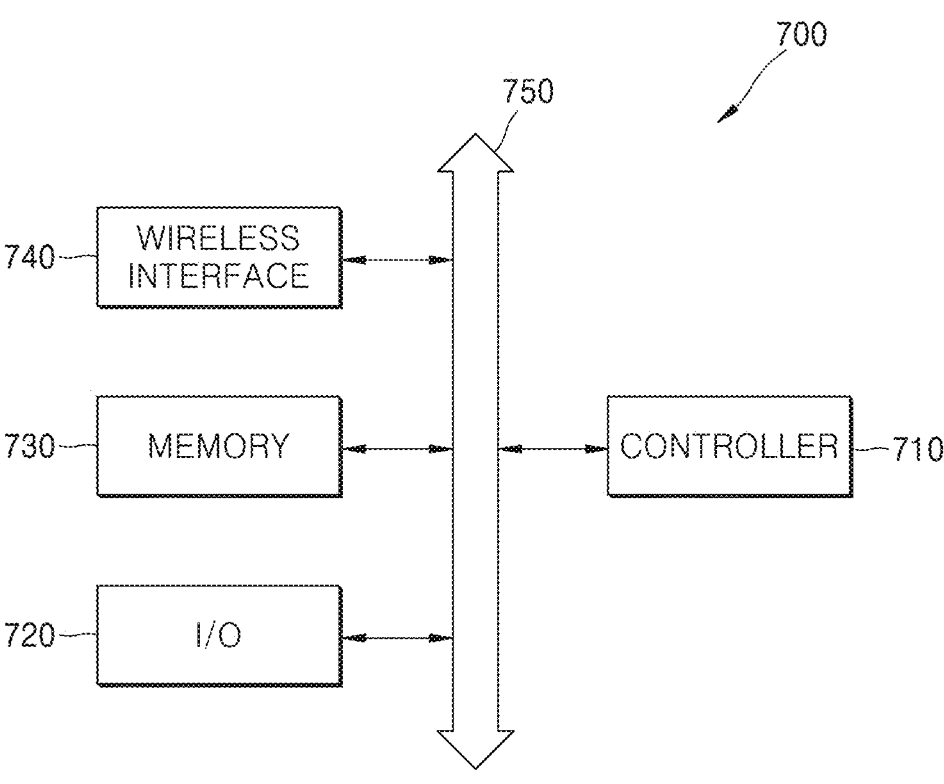
FIG. 11 is a block diagram of an electronic apparatus according to some example embodiments.

FIG. 11 is a block diagram of an electronic apparatus 700 according to some example embodiments. Referring to FIG. 11, an electronic apparatus 700 may constitute a wireless communication device, or a device capable of transmitting and/or receiving information in a wireless environment. The electronic apparatus 700 includes a controller 710, an input/output (I/O) device 720, a memory 730, and a wireless interface 740, which are interconnected through a bus 750.

The controller 710 may include at least one of a microprocessor, a digital signal processor, or a processing apparatus similar thereto. The I/O device 720 may include at least one of a keypad, a keyboard, and a display. The memory 730 may be used to store commands executed by controller 710. For example, the memory 730 may be used to store user data.

In some example embodiments, the memory 730 may include a magnetic tunneling junction device such as one or more of the magnetic tunneling junction devices 100-500 described above.

The electronic apparatus 700 may use the wireless interface 740 to transmit/receive data through a wireless communication network. The wireless interface 740 may include an antenna and/or a wireless transceiver. In some embodiments, the electronic apparatus 700 may be used for a communication interface protocol of a third generation communication system, for example, one or more of a code division multiple access (CDMA), a global system for mobile communications (GSM), a north American digital cellular (NADC), an extended-time division multiple access (E-TDMA), and/or a wide band code division multiple access (WCDMA).

Figure 12:
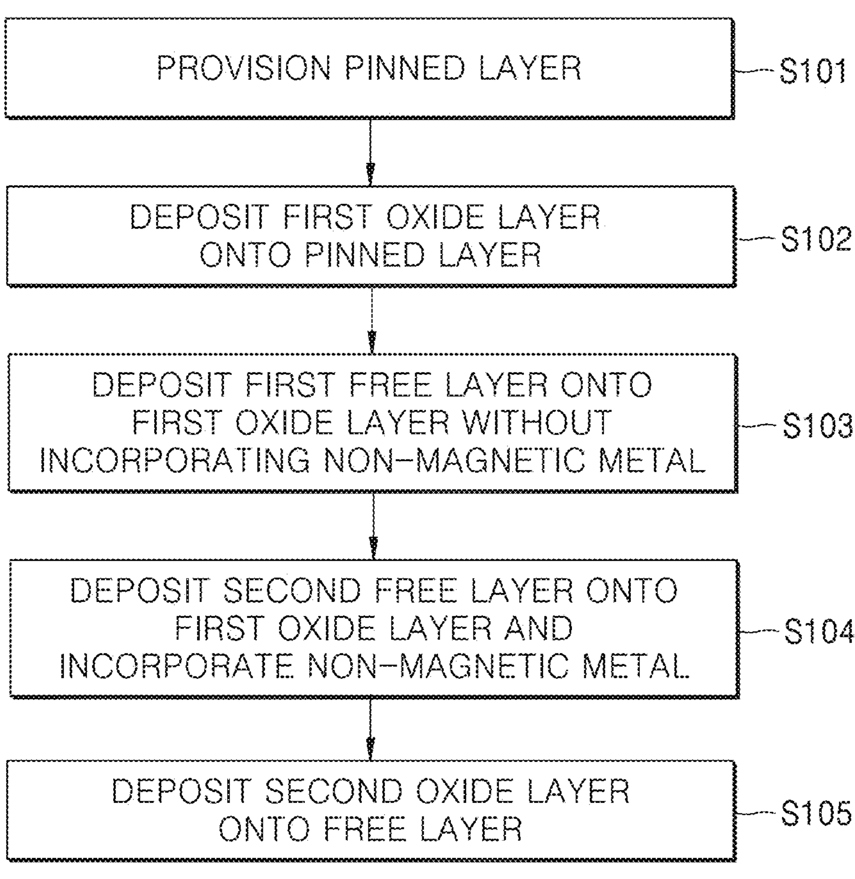
FIG. 12 is a flow diagram illustrating a method of fabricating a magnetic tunneling junction device according to some example embodiments.

FIG. 12 illustrates a method of fabricating a magnetic tunneling junction device, according to some example embodiments.

Referring to FIG. 12, at S101 a pinned layer may be provisioned.

At S102, a first oxide layer may be deposited onto the pinned layer.

At S103, a first free layer may be deposited onto the first oxide layer. There may not be any incorporation of non-magnetic metals.

At S104, a second free layer may be deposited onto the oxide layer. There may be an incorporation of non-magnetic metal.

At S105, a second oxide layer may be deposited onto the free layer.

When reference is made herein to a concentration, the concentration may be measured in various manners, such as but not limited to manners including one or more of a secondary ion mass spectroscopy (SIMS) tool such as a time-of-flight SIMS (TOF-SIMS) tool, electron impedance spectroscopy (EIS), spreading resistance (SRP), or four-point probe (4PP) techniques. Alternatively or additionally, concentration may be measured with one or more of x-ray diffraction (XRD) techniques and/or inductively coupled plasma mass spectrometry techniques. Example embodiments are not limited thereto.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

It should be understood that various example embodiments described herein should be considered in a descriptive sense only and not for purposes of limitation. Descriptions of features or aspects within each example embodiment should typically be considered as available for other similar features or aspects in other embodiments, and example embodiments are not necessarily mutually exclusive with one another. While one or more embodiments have been described with reference to the figures, it will be understood by those of ordinary skill in the art that various changes in form and details may be made therein without departing from the spirit and scope as defined by the following claims.

What is claimed is:

1. A magnetic tunneling junction device comprising:

a free layer having a first surface and a second surface opposite the first surface;

a pinned layer facing the first surface of the free layer;

a first oxide layer between the pinned layer and the free layer; and a second oxide layer on the second surface of the free layer, wherein the free layer comprises a first free layer adjacent to the first oxide layer and a second free layer adjacent to the second oxide layer, and the first free layer comprises a first magnetic material not having a non-magnetic metal incorporated into the first magnetic material of the first free layer, the second free layer comprises a second magnetic material including the non-magnetic metal incorporated into the second magnetic material of the second free layer, wherein the non-magnetic metal of the second free layer comprises at least one of Ru, Ir, Ti, Zn, Al, Sn, W, Sb, V, Cr, Si, Tb, Sc, Y, Rh, In, Ca, Sr, Ba, Mn, Cd, Pb, and Ga, wherein the first oxide layer comprises a first region adjacent to the pinned layer and a second region adjacent to the free layer, and wherein a first proportion of oxygen or nitrogen in the second region is greater than a second proportion of a respective one of oxygen or nitrogen in the first region.

2. The magnetic tunneling junction device of claim 1, wherein the first magnetic material of the first free layer and the second free layer comprises at least one of Fe, Co, Ni, Mn, a Fe-containing alloy, a Co-containing alloy, a Ni-containing alloy, a Mn-containing alloy and a Heusler alloy.

3. The magnetic tunneling junction device of claim 2, wherein the first free layer further comprises boron (B).

4. The magnetic tunneling junction device of claim 3, wherein the second free layer does not comprise boron.

5. The magnetic tunneling junction device of claim 3, wherein the second free layer comprises boron at a second concentration less than a first concentration of the first free layer.

6. The magnetic tunneling junction device of claim 5, wherein a first boron concentration of the first free layer is in a first range of about 5 at % to about 50 at %, and a second boron concentration of the second free layer is within a second range of 0 at % to about 25 at %.

7. The magnetic tunneling junction device of claim 5, wherein the second oxide layer comprises an oxide material configured to absorb boron in the second free layer.

8. The magnetic tunneling junction device of claim 7, wherein the first concentration of boron in the first free layer is at a first peak at a first interface with the first oxide layer and gradually decreases toward the second free layer, and the second concentration of boron in the second free layer is at a second peak at a second interface with the first free layer and gradually decreases toward the second oxide layer.

9. The magnetic tunneling junction device of claim 7, wherein the second oxide layer comprises at least one selected from HfOx, NbOx, TaOx, and WOx.

10. The magnetic tunneling junction device of claim 9, wherein the second oxide layer further comprises boron absorbed from the second free layer.

11. The magnetic tunneling junction device of claim 9, wherein the first oxide layer comprises MgO and the second oxide layer does not comprise MgO.

12. The magnetic tunneling junction device of claim 1, wherein a concentration of the non-magnetic metal in the second free layer is in a range of about 5 at % to about 50 at %.

13. The magnetic tunneling junction device of claim 1, wherein the free layer further comprises a third free layer between the first free layer and the second free layer, the third free layer comprising a third magnetic material doped with a third non-magnetic metal.

14. The magnetic tunneling junction device of claim 13, wherein a second concentration of the non-magnetic metal in the second free layer is greater than a first concentration of the non-magnetic metal in the third free layer.

15. The magnetic tunneling junction device of claim 13, wherein the second free layer and the third free layer comprise different non-magnetic metals.

16. The magnetic tunneling junction device of claim 13, wherein the first free layer further comprises boron, the third free layer comprises boron at a third concentration less than a first concentration of the first free layer, and the second free layer comprises boron at a second concentration less than the third concentration of the third free layer or does not comprise boron.

17. The magnetic tunneling junction device of claim 1, wherein the first oxide layer comprises a metal oxide having a stoichiometrically oxygen-deficient composition.

18. The magnetic tunneling junction device of claim 17, wherein the first oxide layer comprises MgO, and a first proportion of Mg in the MgO of the first oxide layer is greater than 50 at % and a second proportion of O in the MgO is less than 50 at %.

19. The magnetic tunneling junction device of claim 1, wherein the first oxide layer further comprises a metal layer between the first region and the second region.

20. The magnetic tunneling junction device of claim 1, wherein the second oxide layer comprises a metal oxide having a stoichiometrically oxygen-deficient composition.

21. The magnetic tunneling junction device of claim 1, wherein a first oxygen affinity of the non-magnetic metal of the free layer is greater than a second oxygen affinity of the first magnetic material of the free layer.

22. A magnetic tunneling junction device comprising:

a free layer having a first surface and a second surface opposite the first surface;

a pinned layer facing the first surface of the free layer;

a first oxide layer between the pinned layer and the free layer; and a second oxide layer on the second surface of the free layer, wherein the free layer comprises a magnetic material with a non-magnetic metal incorporated into the magnetic material, and a concentration of the non-magnetic metal in the free layer is low at the first surface and continuously varies from the first surface along the second surface, wherein the non-magnetic metal of the free layer comprises at least one of Ru, Ir, Ti, Zn, Al, Sn, W, Sb, V, Cr, Si, Tb, Sc, Y, Rh, In, Ca, Sr, Ba, Mn, Cd, Pb, and Ga, and wherein the concentration of the non-magnetic metal in the free layer is peaked at a distance from the first surface between ⅔ and ⅘ of a total thickness of the free layer, and continuously and gradually decreases from a peak point in a first direction of the first surface and in a second direction of the second surface.

23. The magnetic tunneling junction device of claim 22, wherein the concentration of the non-magnetic metal in the free layer is peaked at the second surface and continuously and gradually increases from the first surface to the second surface.

24. The magnetic tunneling junction device of claim 22, wherein the free layer further comprises boron, wherein a second concentration of boron in the free layer continuously and gradually decreases from the first surface toward the second surface.

25. A memory device comprising:

a plurality of memory cells each comprising a switching device and a magnetic tunneling junction device connected to the switching device, wherein the magnetic tunneling junction device comprises, a free layer having a first surface and a second surface opposite the first surface, a pinned layer facing the first surface of the free layer, a first oxide layer disposed between the pinned layer and the free layer, and a second oxide layer disposed on the second surface of the free layer, wherein the free layer comprises a first free layer adjacent to the first oxide layer and a second free layer adjacent to the second oxide layer, the first free layer comprises a first magnetic material not having a non-magnetic metal incorporated into the first magnetic material of the first free layer, and the second free layer comprises a second magnetic material including the non-magnetic metal incorporated into the second magnetic material of the second free layer, the non-magnetic metal of the second free layer comprises at least one of Ru, Ir, Ti, Zn, Al, Sn, W, Sb, V, Cr, Si, Tb, Sc, Y, Rh, In, Ca, Sr, Ba, Mn, Cd, Pb, and Ga, wherein the first oxide layer comprises a first region adjacent to the pinned layer and a second region adjacent to the free layer, and wherein a first proportion of oxygen or nitrogen in the second region is greater than a second proportion of a respective one of oxygen or nitrogen in the first region.

26. A memory device comprising:

a plurality of memory cells each comprising a switching device and a magnetic tunneling junction device connected to the switching device, wherein the magnetic tunneling junction device comprises, a free layer having a first surface and a second surface opposite the first surface, a pinned layer facing the first surface of the free layer, a first oxide layer disposed between the pinned layer and the free layer, and a second oxide layer disposed on the second surface of the free layer, wherein the free layer comprises a magnetic material doped with a non-magnetic metal, a concentration of the non-magnetic metal in the free layer is low at the first surface and continuously varies from the first surface along the second surface, the non-magnetic metal of the free layer comprises at least one of Ru, Ir, Ti, Zn, Al, Sn, W, Sb, V, Cr, Si, Tb, Sc, Y, Rh, In, Ca, Sr, Ba, Mn, Cd, Pb, and Ga, and wherein the concentration of the non-magnetic metal in the free layer is peaked at a distance from the first surface between ⅔ and ⅘ of a total thickness of the free layer, and continuously and gradually decreases from a peak point in a first direction of the first surface and in a second direction of the second surface.

* * * * *